United States Patent [19]

Ishikawa

[11] Patent Number: 4,770,600
[45] Date of Patent: Sep. 13, 1988

[54] APPARATUS FOR POSITIONING SILICON WAFER

[75] Inventor: Susumu Ishikawa, Aichi, Japan
[73] Assignee: MECS Corporation, Aichi, Japan
[21] Appl. No.: 71,958
[22] Filed: Jul. 10, 1987
[30] Foreign Application Priority Data Sep. 12, 1986 [JP] Japan .................................. 61-216690

[51] Int. Cl.$^4$ ............................................. B65G 47/24
[52] U.S. Cl. ................................. 414/783; 198/394; 414/754
[58] Field of Search .................... 414/744 B, 754, 757, 414/763, 781, 783; 294/2; 406/87; 198/394, 395

[56] References Cited

U.S. PATENT DOCUMENTS

| 4,024,944 | 5/1977 | Adams et al. | 406/87 X |
| 4,457,664 | 7/1984 | Judell et al. | 414/754 X |
| 4,662,811 | 5/1987 | Hayden | 198/394 X |
| 4,685,206 | 8/1987 | Kobayashi et al. | 198/394 X |

Primary Examiner—Leslie J. Paperner
Attorney, Agent, or Firm—Armstrong, Nikaido, Marmelstein & Kubovcik

[57] ABSTRACT

There is disclosed an apparatus for positioning a silicon wafer which comprises: two pieces of supporting boards, fixed to an upper plate, for supporting both side portions of the silicon wafer; an adsorbing disk, disposed in a vertically movable and rotatable manner between the supporting boards, for supporting the silicon wafer in its central position, this adsorbing disk having its upper surface formed with adsorbing holes; a holding member disposed in a vertically movable manner on the circumference of the adsorbing disk between the supporting boards, this holding member having a movable holder which moves inwards by pushing the edge of the silicon wafer when going up while raising the silicon wafer supported on the adsorbing disk; and a photoelectric detector, fitted to a part of the supporting boards, for detecting the edge of an orientation flat of the silicon wafer. The silicon wafer loaded on the supporting boards is raised while being adsorbed by the adsorbing disk. The edge of the ORIFLA is detected by the photoelectric detector provided on the supporting board while rotating the adsorbing disk. On the basis of the thus detected position of the ORIFLA, the adsorbing disk is further rotated through a given angle, thus positioning the silicon wafer so that the ORIFLA is adjusted to a predetermined position.

3 Claims, 3 Drawing Sheets

APPARATUS FOR POSITIONING SILICON WAFER

BACKGROUND OF THE INVENTION (1). Field of the Invention

The present invention relates to an apparatus, used in a step of processing a silicon wafer, for positioning the silicon wafer on the basis of an orientation flat (hereinafter abbreviated to ORIFLA).

(2). Prior Art

When the silicon wafer is carried to a processing device by means of a robot or the like in a step of processing or measuring the silicon wafer, it is required to position the wafer on the basis of the ORIFLA defined as a flat notch formed in the silicon wafer.

For this reason, according to a conventional method, the silicon wafer is rotatably supported; a rubber roller is pushed against the circumference of the wafer; the wafer is turned by rotationally driving the rubber roller; and the wafer is halted just when the rubber roller is separated from the wafer in a position wherein the ORIFLA reaches the rubber roller, thus positioning the silicon wafer.

Inevitably, there is created unevenness in positioning the wafer on the basis of the ORIFLA because of inertial rotation of the silicon wafer, and it is unfeasible to accurately position the wafer. In the conventional positioning apparatus, the stopping position is predetermined, and hence it is unfavourably impossible to arbitrarily position the silicon wafer.

SUMMARY OF THE INVENTION

An apparatus for positioning a silicon wafer according to the present invention comprises: two pieces of supporting boards, fixed to an upper plate, for supporting both side portions of a silicon wafer; an adsorbing disk, disposed in a vertically movable and rotatable manner between two pieces of the supporting boards, for supporting the silicon wafer in the central position thereof with the aid of adsorbing holes formed in its upper surface; a holding member, disposed in a vertically movable manner on the circumference of the adsorbing disk between the supporting boards, this holding member being provided with a movable holder which internally moves by pushing the edge of the silicon wafer when it rises while raising the silicon wafer supported on the adsorbing disk; and a photoelectric detector, fitted to a part of the supporting boards, for detecting the edge of the ORIFLA of the silicon wafer.

In the thus constituted positioning apparatus, at the first onset, the silicon wafer loaded on the supporting boards is slightly raised while being adsorbed by the adsorbing disk. The edge of the ORIFLA is detected by the photoelectric detector provided on the supporting board while permitting the adsorbing disk to rotate, and the ORIFLA of the silicon wafer can be adjusted to a predetermined position by permitting the adsorbing disk to further rotate through a given angle on the basis of a position in which the ORIFLA is detected. Moreover, it is possible to position the wafer so that the ORIFLA faces to arbitrary positions. In addition, the silicon wafer can accurately be adjusted to the invariable position with the help of the movable holder of the holding member.

It is a primary object of the present invention to provide the positioning apparatus capable of accurately and quickly setting the silicon wafer in a predetermined arbitrary position.

DESCRIPTION OF THE PREFERRED EMBODIMENTS

The embodiments of the present invention will hereinafter be described with reference to the accompanying drawings.

Figure 1:
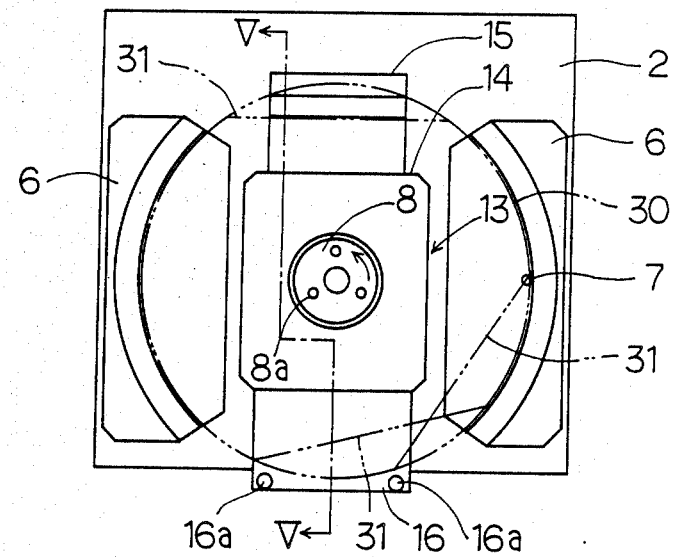
FIG. 1 is a plan view of a positioning apparatus, showing one embodiment of the present invention.
Figure 2:
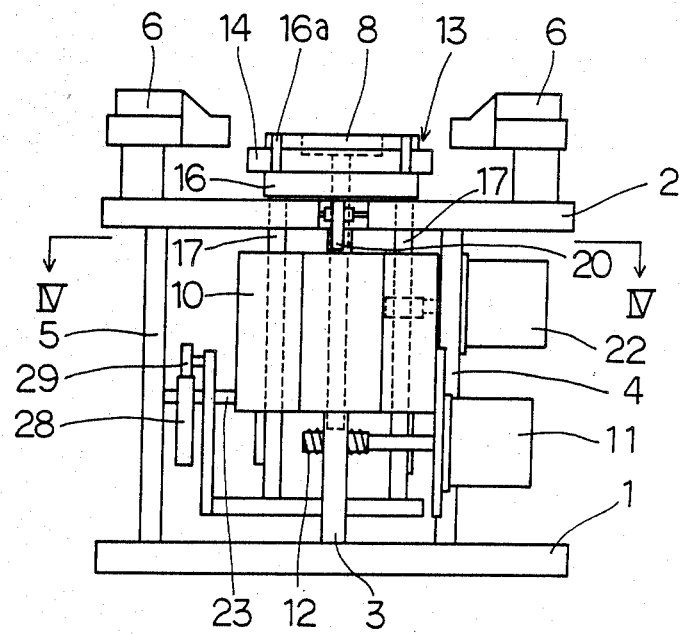
FIG. 2 is a front view showing a situation where a cover thereof is removed.
Figure 3:
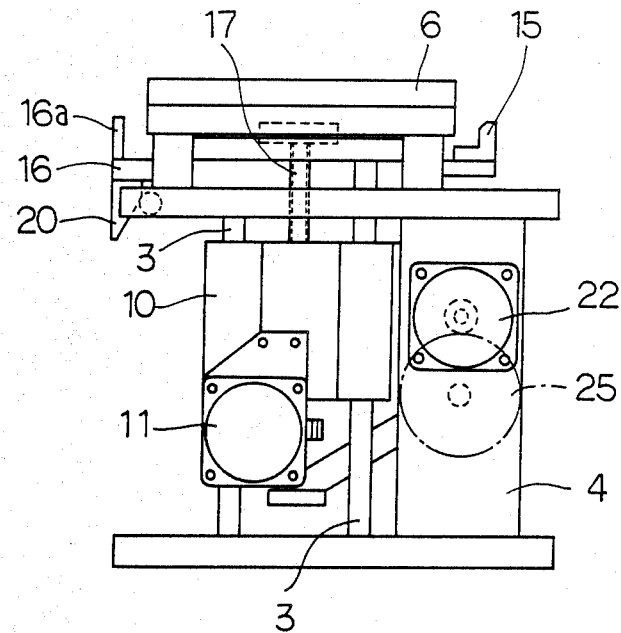
FIG. 3 is a right side view thereof.
Figure 4:
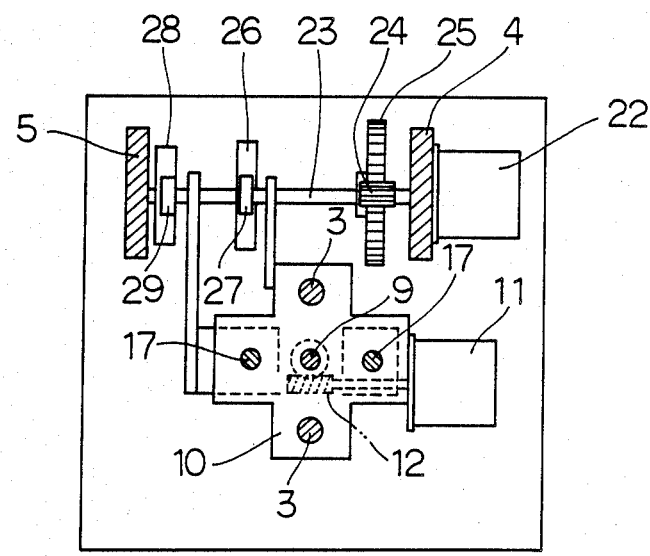
FIG. 4 is a sectional view taken substantially along the line IV—IV of FIG. 2.

FIG. 1 is a plan view of an apparatus for positioning a silicon wafer, and FIG. 2 is a front view showing a situation where a cover thereof is removed. An upper plate 2 is horizontally fixed through two lengths of fixing shafts 3 and two pieces of fixing frames 4, 5 to a bottom plate 1. Supporting boards 6 assuming the same configuration are bilaterally disposed on the upper plate 2. A semi-elliptical recessed portion is formed in each individual supporting board 6 to support the side portion of a silicon wafer 30 in a fixed position. At the central portion of the right supporting board 6 is provided a photoelectric detector 7 for detecting the edge of an ORIFLA 31 of the silicon wafer 30 loaded on the supporting boards 6. This photoelectric detector 7 is composed by, for instance, a light projecting element and a light receiving element. When the silicon wafer 30 is placed on the supporting boards 6, the light receiving element receives the light reflected therefrom. When the wafer turns round and then the edge of the ORIFLA 31 reaches the photoelectric detector, the ORIFLA 31 can be detected from the fact that the reflected light disappears.

On the upper plate 2 an adsorbing disk 8 is fixed to a rotary shaft 9 which penetrates the upper plate 2 and protrudes upwards therefrom. Adsorbing holes 8a each communicating with unillustrated inside suction passage are formed in the upper surface of the adsorbing disk 8. The rotary shaft 9 is rotatably inserted in a vertical movement block 10 positioned beneath the upper plate 2, this rotary shaft 9 moving up and down together with this vertical movement block 10. Two lengths of fixing shafts 3 penetrate the vertical movement block 10, and this block 10 is vertically driven, with the two fixing shafts 3 serving as guide shafts, by the actuation of a cam which will be mentioned later. A step motor 11 for rotationally driving the adsorbing disk is installed through an installation bracket to the side portion of the vertical movement block 10. A rotary shaft of the step motor 11 is connected through a worm 12 and a worm wheel to the rotary shaft 9.

Figure 5:
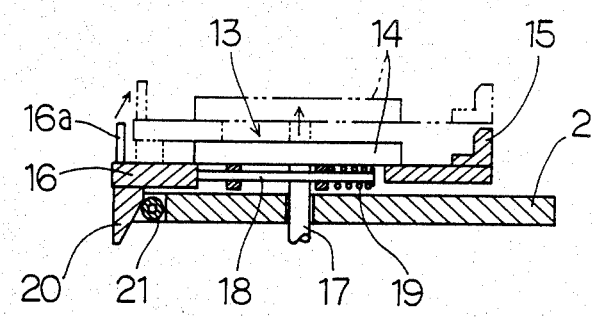
FIG. 5 is a sectional view taken substantially along the line V—V of FIG. 1.

A holding member 13 is fixed to two lengths of slide shafts 17 which project from the upper plate 2 between the two supporting boards 6 on the circumference of the adsorbing disk 8 disposed on the upper plate 2. This holding member 13 consists of a level tabular holding body 14, an edge holder 15 fixed to the rear portion of the holding body 14 and a movable holder 16 which is movably fitted to the front portion of the holding body 14. The holding member 13 serves to raise the silicon wafer 30 disposed on the adsorbing disk 8 and to simultaneously hold the wafer while it is sandwiched in between the edge holder 15 and the movable holder 16. The holding body 14 is fixed to the two slide shafts 17 which penetrate the upper plate 2 and project upwards. Two pieces of pins 16a are vertically so provided at the tip end of the movable holder 16 as to push the edge of the silicon wafer 30. The movable holder 16 is, as illustrated in FIG. 5, arranged to be accessible to the lower portion of the holding body 14. The movable holder 16 is fixed to the tip ends of two lengths of rods 18 which are supported in a horizontally slidable manner through a bearing on the lower portion of the holding body 14. On the terminal portion of the rod 18 is wound a coil spring 19 for biasing the rod, i.e., the movable holder 16 inwards. A substantially triangular cam plate 20 is longitudinally fixed to the underside of the movable holder 16, and a cam follower 21 is provided at the end of the upper plate 2. Upon a descent of the holding member 13 with a rise of the slide shafts 17, the movable holder 16 moves inwards while going up by the action of the cam plate 20.

On the other hand, a step motor for driving the cam is fixed to a fixing frame 4, and a cam shaft 23 is axially supported between the fixing frames 4, 5 which are positioned below the step motor 22. A rotary shaft of the step motor 22 is linked through a pinion 24 and a gear 25 to the cam shaft 23. A cam 26 is axially secured to the intermediate portion of the cam shaft 23. A cam follower 27 fixed through an arm to the vertical movement block 10 impinges upon the cam 26. Another cam 28 is axially secured to the cam shaft 23, and a cam follower 29 which is axially supported through a bracket on a connecting plate fixed to the lower ends of the two slide shafts 17 impinges upon the cam 28. These cams 26, 28 are rotationally driven by the step motor 22; at first the adsorbing disk 8 is lifted by raising the vertical movement block 10 by means of the cam 26; and then the holding member 13 is ascended by raising the two slide shafts 17 by the cam 28.

In the second place, the operations of the positioning apparatus will hereinafer be described. The positioning apparatus is in a state shown in FIGS. 1 to 5, viz., the adsorbing disk 8 and the holding member 13 are stationary in the lowest positions.

In this state, the silicon wafers 30 are loaded on the supporting boards 6 by means of a variety of carrer systems. Inasmuch as semi-elliptical recessed portions each corresponding to a diameter of the silicon wafer to be used are formed in the bilaterally disposed supporting boards 6, the silicon wafer 30 is loaded in the precise position. However, the position of the ORIFLA 31 is set at ramdom.

Figure 6:
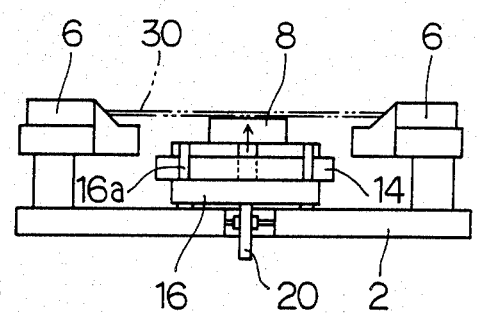
FIGS. 6 and 7 are partial front views each showing an operational state thereof.

The vertical movement block 10 is raised up to the intermediate position by rotating the cam 26 through the cam shaft 23. With this step, as shown in FIG. 6, the adsorbing disk 8 slightly raises (for instance, about 2 mm) the silicon wafer 30 loaded on the supporting boards. At this time, the suction is effected from the adsorbing holes 8a formed in the adsorbing disk 8, whereby the silicon wafer 30 is adsorbed onto the adsorbing disk 8.

When the rotation step motor 11 is actuated, the adsorbing disk 8 is rotated through the rotary shaft 9 in a given direction (for example, the anticlockwise direction of FIG. 1), whereby the silicon wafer 30 rotates a little bit above the supporting boards 6. At this time, a control circuit for inputting photoelectric signals outputted from the photoelectric detector 7 detects the time when the photoelectric detector 7 detects the edge of the ORIFLA 31, i.e., the time when the ORIFLA 31 comes just above the photoelectric detector 7 and a reflected-light-receiving-state disappears from a state in which the silicon wafer 30 receives the reflected light while standing above the photoelectric detector 7. Thereafter, the control circuit causes both the adsorbing disk 8 to further rotate through a given angle (for instance 120°) and the step motor 11 to halt.

Owing to this process, the silicon wafer 30 on the adsorbing disk 8 is disposed so that the ORIFLA 31 thereof is in a position having a given angle (for example, just behind it).

Figure 7:
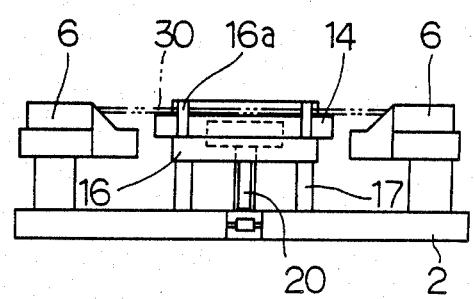

In the wake of this step, the adsorbing operation of the adsorbing disk is stopped, and the step motor 22 designed for the cam is actuated, thereby rotating the cam 28 through the cam shaft 23. The holding member 13 is raised through the two slide shafts 17 up to a position (FIG. 7) a little bit higher than the adsorbing disk by the action of the cam 28. At this time, the movable holder 16 of the holding member 13, as shown in FIG. 5, moves inwards while going up by dint of the cam plate 20 and the coil spring 19. The silicon wafer 30 disposed on the adsorbing disk 8 is lifted by the holding body 14 while being pushed towards the edge holder 15 by means of the pins 16a provided on the movable holder 16, thus properly adjusting the to-and-fro positions of the silicon wafer 30.

The cam step motor 22 continuously behaves to permit the cams 26, 28 to constantly rotate, whereby the holding member 13 begins to descend from its rising end. As a result, the adsorbing disk 8 is also lowered. Just when the respective constituent members revert to their initial positions depicted in FIGS. 1 to 5, the step motor 22 halts. Then the as-positioned silicon wafer 30 held on the holding member 13 is lowered down on the supporting boards 6, thus completing the present positioning operation of the silicon wafer 30.

The silicon wafer 30, the ORIFLA 31 of which is positioned at the specified angle, for example, just behind it, is transferred as it is onto the stage of a descent processing device or a measuring device by the carrier system such as a robot or the like.

As can be clarified from the description so far made, the silicon wafer positioning apparatus according to the present invention yields the following effects. The silicon wafer loaded on the supporting boards is slightly raised while being adsorbed by the adsorbing disk. The edge of the ORIFLA is detected by the photoelectric detector provided on the supporting board while rotating the adsorbing disk. On the basis of the thus detected position of the ORIFLA, the ORIFLA of the silicon wafer is adjusted to the predetermined position by rotating the adsorbing disk through the specified angle. With this arrangement, it is feasible to position the silicon wafer so that the ORIFLA faces to arbitrary positions. After positioning the ORIFLA, the silicon wafer on the adsorbing disk is pushed from one side and is then positioned while being raised by the holding member once again. Thereafter, the wafer is lowered down on the supporting boards. Hence, it is possible to adequately adjust the position of the silicon wafer.

What is claimed is:

1. An apparatus for positioning a silicon wafer, comprising:
   (a) an upper plate;
   (b) two pieces of supporting boards, fixed to said upper plate, for supporting both side portions of said silicon wafer;
   (c) an adsorbing disk, disposed in a vertically movable and rotatable manner between said supporting boards, for supporting said silicon wafer at its central position, said adsorbing disk including adsorbing holes formed in its upper surface;
   (d) a holding member disposed in a vertically movable manner on the circumference of said adsorbing disk between said supporting boards, said holding member having a movable holder which moves inwards by pushing the edge of said silicon wafer when going up while raising said silicon wafer supported on said adsorbing disk with the aid of a holding body; and
   (e) a photoelectric detector, fitted to a part of said supporting boards, for detecting the edge of an orientation flat of said silicon wafer.

2. An apparatus for positioning a silicon wafer as set forth in claim 1, wherein said holding body of said holding member is horizontally fixed to a plurality of slide shafts which protrude from said upper plate, an edge holder is fixed to the rear portion of said holding body, a movable holder is so provided at the front portion of said holding body as to be movable to and fro, and said silicon wafer is so held as to be sandwiched in between said edge holder and said movable holder when said silicon wafer supported on said adsorbing disk is raised by ascending said holding body.

3. An apparatus for positioning a silicon wafer as set forth in claim 1, wherein said adsorbing disk rotates while said silicon wafer is adsorbed onto the upper surface thereof and is then raised, and said adsorbing disk further rotates through a given angle just when said photoelectric detector detects said orientation flat of said silicon wafer.

* * * * *